United States Patent
Chen et al.

(10) Patent No.: US 11,069,661 B1
(45) Date of Patent: Jul. 20, 2021

(54) ELECTRONIC PACKAGE

(71) Applicant: SILICONWARE PRECISION INDUSTRIES CO., LTD., Taichung (TW)

(72) Inventors: Wei-Jhen Chen, Taichung (TW); Yu-Lung Huang, Taichung (TW); Chee-Key Chung, Taichung (TW); Chang-Fu Lin, Taichung (TW); Yuan-Hung Hsu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/909,043

(22) Filed: Jun. 23, 2020

(51) Int. Cl.
| | |
|---|---|
| *H01L 25/065* | (2006.01) |
| *H01L 23/00* | (2006.01) |
| *H01L 23/538* | (2006.01) |
| *H01L 23/31* | (2006.01) |

(52) U.S. Cl.
CPC .......... *H01L 25/0657* (2013.01); *H01L 23/31* (2013.01); *H01L 23/5386* (2013.01); *H01L 23/562* (2013.01)

(58) Field of Classification Search
CPC . H01L 25/0657; H01L 23/31; H01L 23/5386; H01L 23/562
USPC .............. 257/777, 621, 686, 706, 737, 774, 257/E23.001, E23.011, E23.013, E23.067, 257/E23.141, E23.179, E21.499, E21.502, 257/E21.505, E21.521, E21.705, E25.013, 257/E29.112; 438/108, 107, 109, 127
See application file for complete search history.

(56) References Cited

U.S. PATENT DOCUMENTS

| | | | |
|---|---|---|---|
| 9,099,459 B2 * | 8/2015 | Sato | H01L 25/50 |
| 10,497,688 B2 * | 12/2019 | Tsukiyama | H01L 25/18 |
| 10,553,560 B2 * | 2/2020 | Watanabe | H01L 24/97 |
| 10,607,964 B2 * | 3/2020 | Fukayama | H01L 24/14 |
| 2011/0147945 A1 * | 6/2011 | Yoshida | H01L 21/563 |
| | | | 257/774 |
| 2012/0074529 A1 * | 3/2012 | Kim | H01L 25/50 |
| | | | 257/621 |
| 2013/0137216 A1 * | 5/2013 | Ito | H01L 25/50 |
| | | | 438/108 |
| 2013/0234320 A1 * | 9/2013 | Lu | H01L 24/97 |
| | | | 257/737 |
| 2018/0277515 A1 * | 9/2018 | Homma | H01L 21/78 |

* cited by examiner

*Primary Examiner* — Dao H Nguyen
(74) *Attorney, Agent, or Firm* — Kelly & Kelley, LLP

(57) ABSTRACT

An electronic package is formed by arranging two encapsulating portions of different materials between a plurality of electronic components stacked to each other to adjust a stress distribution of the electronic package, so that the degree of warpage of the electronic package can be optimally controlled.

18 Claims, 8 Drawing Sheets

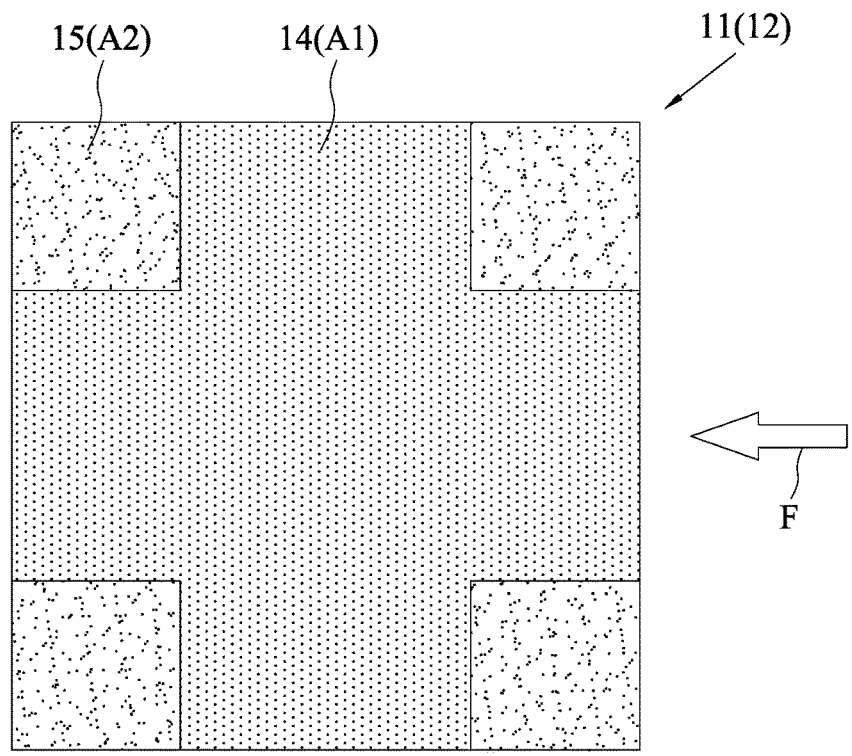
FIG. 1'
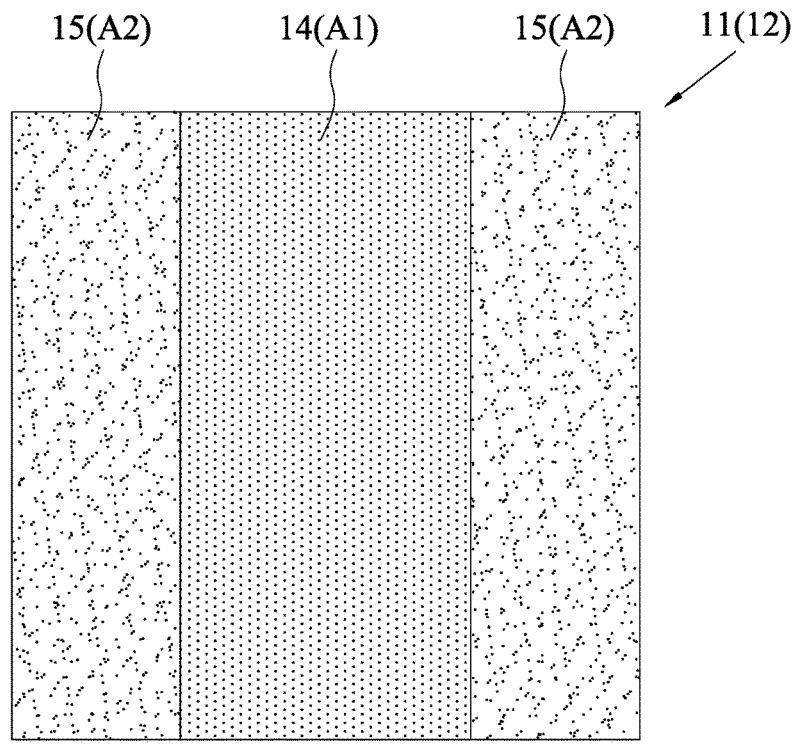
FIG. 1"

ELECTRONIC PACKAGE

TECHNICAL FIELD

The present disclosure relates to semiconductor packaging process, and more particularly, to an electronic package with multiple stacked chips and a manufacturing method for the same.

BACKGROUND

With the rapid development of the electronic industry, electronic products nowadays are designed with compactness, lightweight, and multiple functions in mind, and various different packaging techniques have thus been developed. Among which, flip chip bonding packaging technique has been developed to satisfy the demands for high integration, miniaturization, high circuit performance, high circuit efficiency and the like for semiconductor devices. Moreover, in order to enhance the performance and capacity of a single semiconductor package for meeting the trends of miniaturization, large capacity and high speed for electronic products, multichip module (MCM) has been adopted in a single semiconductor package in which a number of semiconductor chips or dies are flip-chip stacked on a unifying carrier (e.g., a package substrate or a lead frame). Examples of this can be found in, for example, TW Patent No. 11331371 (referred to as prior art 1 hereinafter) or TW Patent No. 1527170 (referred to as prior art 2 hereinafter).

However, in a conventional MCM, such as that described in prior art 1, a gap exists between an upper die and a lower die, which makes the dies susceptible to warpage or even cracks during subsequent high temperature processes.

Moreover, in prior art 1, conductive bumps (e.g., reference numeral 39) for electrically connecting the upper and lower dies are not encapsulated by an encapsulant (e.g., reference numeral 38), therefore the stress of these conductive bumps cannot be effectively distributed, resulting in warpage of the dies. This creates a shift in the alignment between the upper and lower dies and significantly affects the electrical connections between the upper and lower dies, lowering the yield and the reliability of the products. Moreover, as the number of layers of dies stacked to each other increases, stress accumulates and warpage towards the same direction becomes more prominent, which makes the dies more prone to cracks.

On the other hand, in prior art 2, an underfill material (e.g., reference numerals 18*a*, 18*b*, 18*c*) is applied between upper and lower dies to encapsulate conductive bumps (e.g., reference numerals 172, 173, 262, 263, 25*a*) electrically connecting the upper and lower dies. However, there is a mismatch in the coefficients of thermal expansion (CTEs) of the conductive bumps and the underfill. As a result, thermal stress cannot be distributed evenly. During a thermal cycle, the underfill and the dies may exert forces towards each other, resulting in warpage of the dies. This similarly introduces a shift in the alignment between the upper and lower dies and significantly affects the electrical connections between the upper and lower dies, lowering the yield and the reliability of the products. Moreover, as the number of layers of dies stacked to each other increases, stress accumulates and warpage towards the same direction becomes more prominent, which makes the dies more prone to cracks.

Furthermore, although an encapsulant (e.g., reference numerals 19*a*, 19*c*, 19*c*) is used to encapsulate the underfill to help the underfill spread out the stress of the conductive bumps, the encapsulant does not encapsulate the conductive bumps, so the distribution of the stress of the conductive bumps is not effective.

Therefore, there is a need for a solution that addresses the aforementioned shortcomings in the prior art.

SUMMARY

In view of the aforementioned shortcomings of the prior art, the present disclosure provides an electronic package, which may include: a carrier; a first package module disposed on the carrier and including at least one first electronic component, with a first layout area being defined by a lower surface of the first electronic component and provided with one of a first encapsulating portion and a second encapsulating portion, and a material of the second encapsulating portion being different from that of the first encapsulating portion; and a second package module stacked on top of the first package module and including a plurality of second electronic components stacked to each other, with a second layout area being defined by a lower surface of each of the second electronic components, at least one of the plurality of second layout areas being provided with the other one of the first encapsulating portion and the second encapsulating portion relative to the first layout area, wherein a stress balance line is defined between the first package module and the second package module, and the first encapsulating portion and the second encapsulating portion are arranged in a way such that the strain of the first package module and the strain of the second package module are complementary to each other, and the stress of the first package module and the stress of the second package module cancel each other out.

In the electronic package above, the first encapsulating portion and the second encapsulating portion are partially provided on the first layout area.

In the electronic package above, the first encapsulating portion and the second encapsulating portion are partially provided on the second layout area.

In the electronic package above, the first encapsulating portion is provided on the entirety of the first layout area.

In the electronic package above, the first encapsulating portion a is provided on the entirety of the second layout area.

In the electronic package above, the second encapsulating portion is provided on the entirety of the first layout area.

In the electronic package above, the second encapsulating portion is provided on the entirety of the second layout area.

In the electronic package above, the coefficient of thermal expansion (CTE) of the first encapsulating portion is different from that of the second encapsulating portion.

In the electronic package above, the second encapsulating portion is a solid filler.

In the electronic package above, the plurality of second electronic components are stacked to each other via a plurality of conductive components.

In the electronic package above, the second electronic component is stacked on top of the first electronic component via a plurality of conductive components.

In the electronic package above, the first electronic component is stacked on top of the carrier via a plurality of conductive components.

In the electronic package above, a plurality of first electronic components are stacked on top of the carrier, and the first electronic components are stacked to each other via a plurality of conductive components.

The electronic package above may further include a packaging layer encapsulating the first electronic component and the second electronic components.

In the electronic package above, the first layout area is defined with a first segment and a second segment adjacent to the first segment, and the first segment is crisscross or quadrangle in shape.

In the electronic package above, the second layout area is defined with a first segment and a second segment adjacent to the first segment, and the first segment is crisscross or quadrangle in shape.

In the electronic package above, the second encapsulating portion is provided at one or more corners of the first layout area or the second layout area.

In the electronic package above, the second encapsulating portion is provided at two opposite outer sides of the first layout area or the second layout area.

As can be seen from the above, in the electronic package of the present disclosure, the first and second encapsulating portions can be arranged to create strains in different directions. Therefore, compared to the prior art, based on the overall strain situation of the electronic package, the first and second encapsulating portions of the present disclosure can be arranged to adjust the distribution of stress of the electronic package, so as to attain an optimal control in the degree of warpage of the electronic package.

BRIEF DESCRIPTION OF THE DRAWINGS

FIGS. 1' and 1" are top views depicting different aspects of FIG. 1.

FIGS. 2', 2A and 2A' are cross-sectional diagrams depicting other aspects of FIG. 2.

DETAILED DESCRIPTION OF THE EMBODIMENTS

Figure 1:
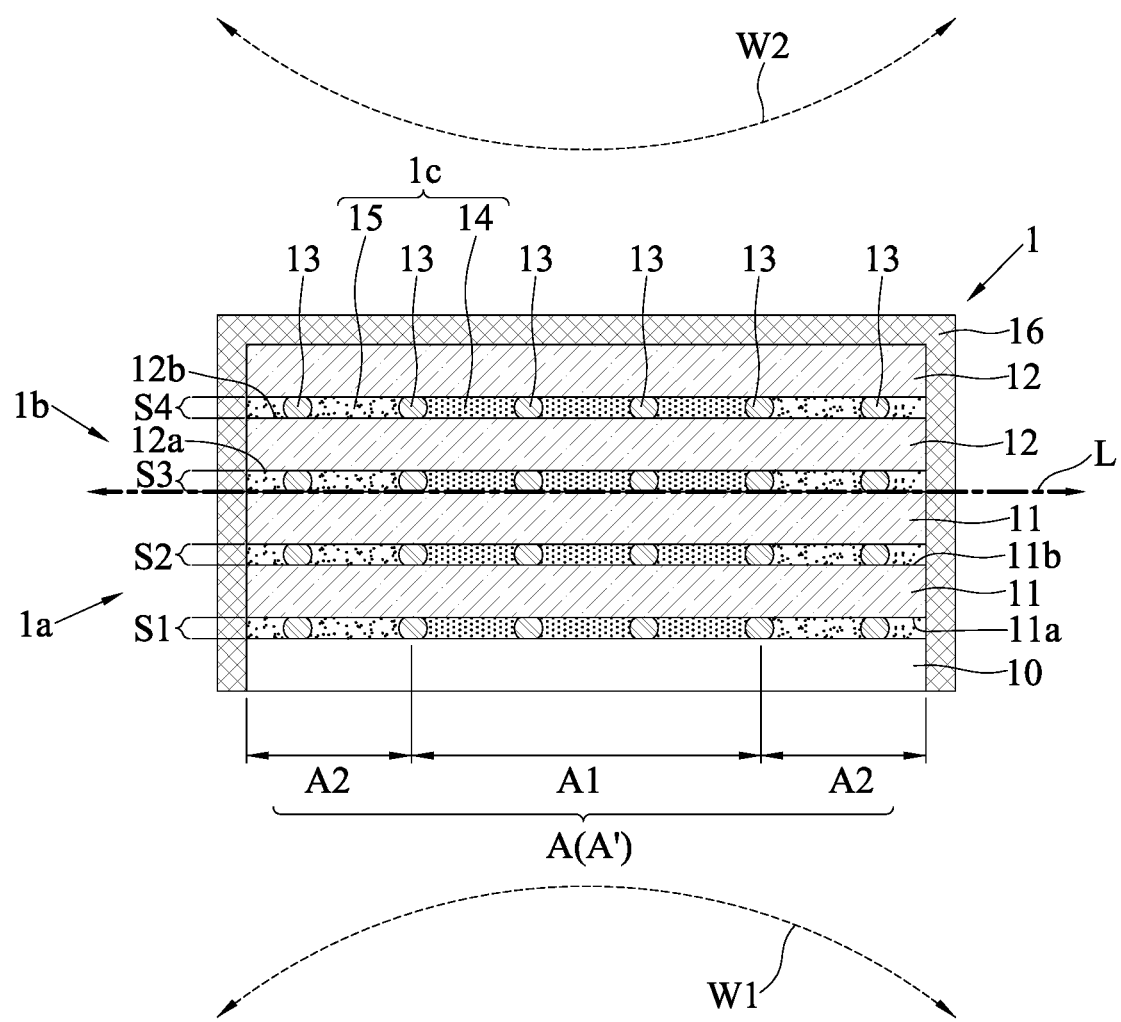
FIG. 1 is a cross-sectional schematic diagram depicting an electronic package in accordance with an embodiment of the present disclosure.

Implementations of the present disclosure are described below by specific embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "first," "second," "above," "below," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 1 is a cross-sectional schematic diagram depicting an electronic package 1 in accordance with the present disclosure. As can be seen in FIG. 1, the electronic package 1 includes a carrier 10, a first package module 1a provided on the carrier 10, and a second package module 1b stacked on the first package module 1a. The first package module 1a and the second package module 1b are stacked to each other via a plurality of conductive components 13. The first package module 1a and the second package module 1b are encapsulated by a packaging layer 16.

The first package module 1a includes at least one first electronic component 11. A first layout area A is defined by the lower surface of the first electronic component 11 and is provided with a encapsulating structure 1c, wherein the encapsulating structure 1c includes a first encapsulating portion 14 and/or a second encapsulating portion 15, and the material of the second encapsulating portion 15 is different from that of the first encapsulating portion 14.

The second package module 1b includes a plurality of second electronic components 12 stacked to each other. A second layout area A' is defined by the lower surface of the second electronic component 12 and is provided the first encapsulating portion 14 and/or the second encapsulating portion 15, wherein the first electronic component 11 and the second package module 1b are stacked using a plurality of conductive components 13, and the conductive components 13 are coated with the encapsulating structure 1c.

The carrier 10 can be, for example, package substrate including a core layer and a routing structure or a coreless routing structure. The carrier 10 includes at least one insulating layer and at least one a routing layer joined with the insulating layer, such as a fan out redistribution layer (RDL). It can be appreciated that the carrier 10 can also be other types of board for carrier a die or IC, such as a lead frame a wafer or other carrier board with metal routings. The present disclosure is not limited as such.

In an embodiment, there are many ways in which the carrier 10 can be manufactured. For example, copper routing layers can be made using a wafer manufacturing process, and silicon nitride or silicon oxide can be formed using chemical vapor deposition (CVD) as the insulating layer. Alternatively, copper routing layers can be formed using an ordinary non-wafer manufacturing process, and a low-cost polymer dielectric material, such as polyimide (PI), polybenzoxazole (PBO), a prepreg (PP), a molding compound, a photosensitive dielectric layer, etc., can be coated as the insulating layer.

In an embodiment, the quantity of first electronic component 11 is two. The first electronic components 11 are stacked one on top of the other, and one of which is disposed on the carrier 10, and the plurality of second electronic components 12 are stacked one on top of the other, and one of which is stacked on the first electronic components 11.

In an embodiment, the first electronic components 11 can be active components, passive components or a combination of the above, wherein the active components are, for example, semiconductor chips, and the passive components are, for example, resistors, capacitors and inductors. In one example, the first electronic components 11 are semiconductor chips with the upper surfaces as stack sides 11b and the lower surfaces as flip chip sides 11a, so that the flip chip side 11a of one of the first electronic components 11 is combined and electrically connected with the stack side 11b of another one of the first electronic components 11 in a flip-chip manner via a plurality of bump-like conductive components 13 (e.g., solder materials, metal pillars, etc.), and the lowermost first electronic component 11 is provided on the carrier 10 via the conductive components 13 and electrically connected with the routing layers of the carrier 10.

Moreover, the second electronic components 12 can be active components, passive components or a combination of the above, wherein the active components are, for example, semiconductor chips, and the passive components are, for example, resistors, capacitors and inductors. In one example, the second electronic components 12 are semiconductor chips with the upper surfaces as stack sides 12b and the lower surfaces as flip chip sides 12a, so that the flip chip side 12a of one of the second electronic components 12 is combined and electrically connected with the stack side 12b of another one of the second electronic components 12 in a flip-chip manner via a plurality of conductive components 13, and the lowermost second electronic component 12 is combined on the stack side 11b of the first electronic component 11 via the conductive components 13 and electrically connected with the first electronic component 11.

Moreover, the entire lower surface (e.g., the flip chip side 11a) of each first electronic component 11 and the entire lower surface (e.g., the flip chip side 12a) of each second electronic component 12 are used as the first and second layout areas A, A', respectively. For example, the first and second layout areas A, A' can be quadrangle such as a square, but the present disclosure is not limited as such. A first segment A1, for example, a crisscross shaped first segment A1 shown in FIG. 1' or a rectangular first segment A1 shown in FIG. 1", and at least one second segment A2 adjacent the first segment A1 can be defined for the first and second layout areas A, A' as required.

Figure 4:
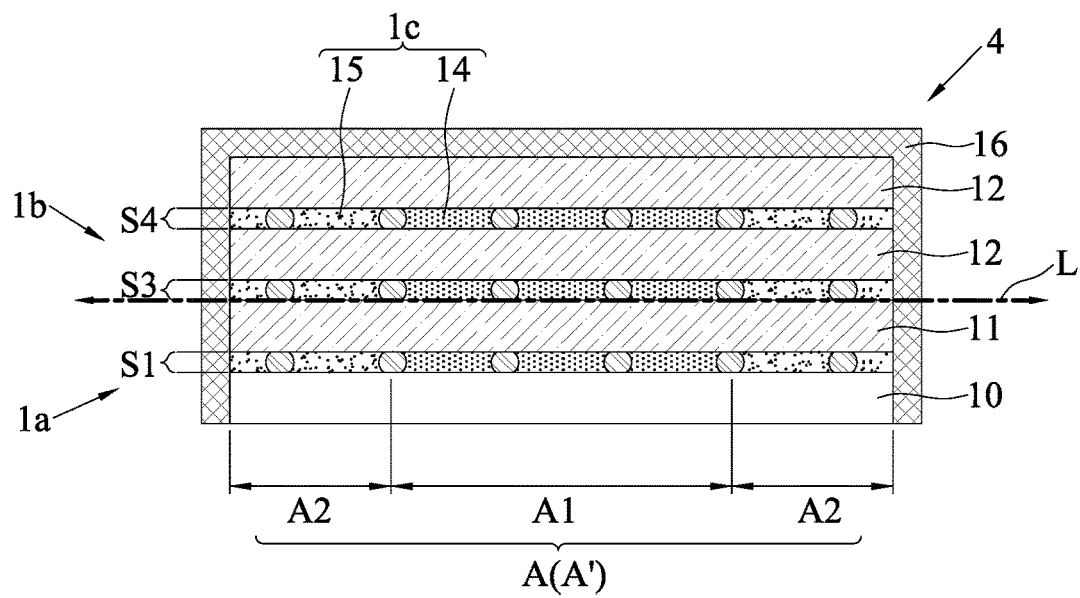
FIGS. 4 and 4' are cross-sectional diagrams depicting other different aspects of FIG. 1.
Figure 4:
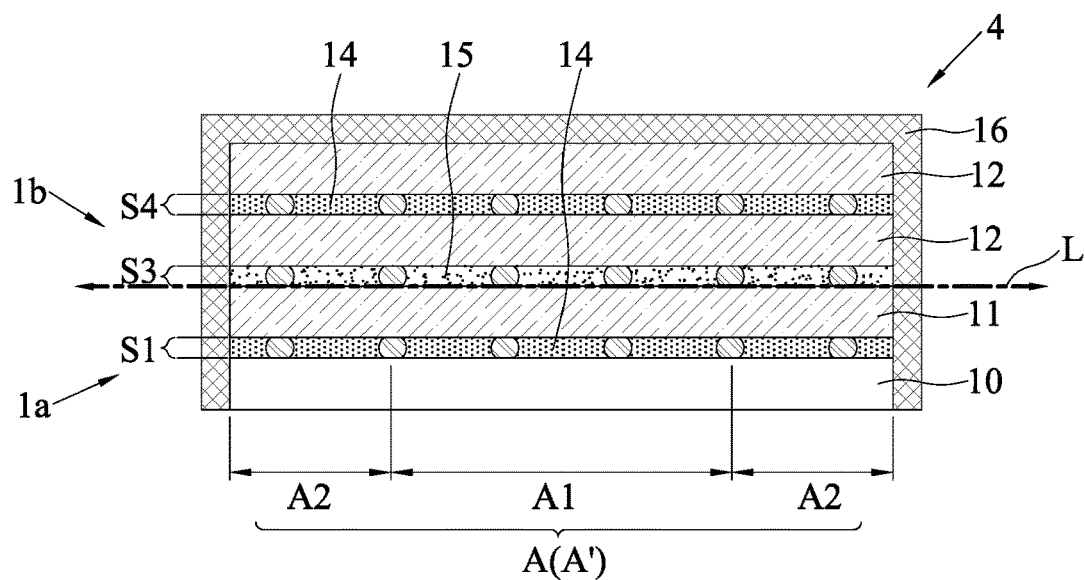

Furthermore, a first fill space S1 is formed between the first electronic component 11 and the carrier 10; a second fill space S2 is formed between the first electronic components 11; a third fill space S3 is formed between the first electronic component 11 and the second electronic component 12; and a fourth fill space S4 is formed between the second electronic components 12. It can be appreciated that the quantity of the second fill space S2 can be determined according to the needs, such as none (in an embodiment shown in FIG. 4 or FIG. 4' wherein there is one first electronic component 11) or more than one, and there is no particular limits, and the quantity of the fourth fill space S4 can also be determined according to the needs, such as one or more, and there is no particular limits.

The first encapsulating portion 14 is a underfill material in a fluid state with the coefficients of thermal expansion (CTE) approximately between 52 and 109.

In an embodiment, the first encapsulating portion 14 is partially provided on the first and second layout areas A, A'. For example, the first encapsulating portion 14 is only provided on the first segment A1, such as those shown in FIGS. 1' and 1". The first encapsulating portion 14 is partially provided on each of the layout areas A of the first to fourth fill space S1 to S4.

Figure 2:
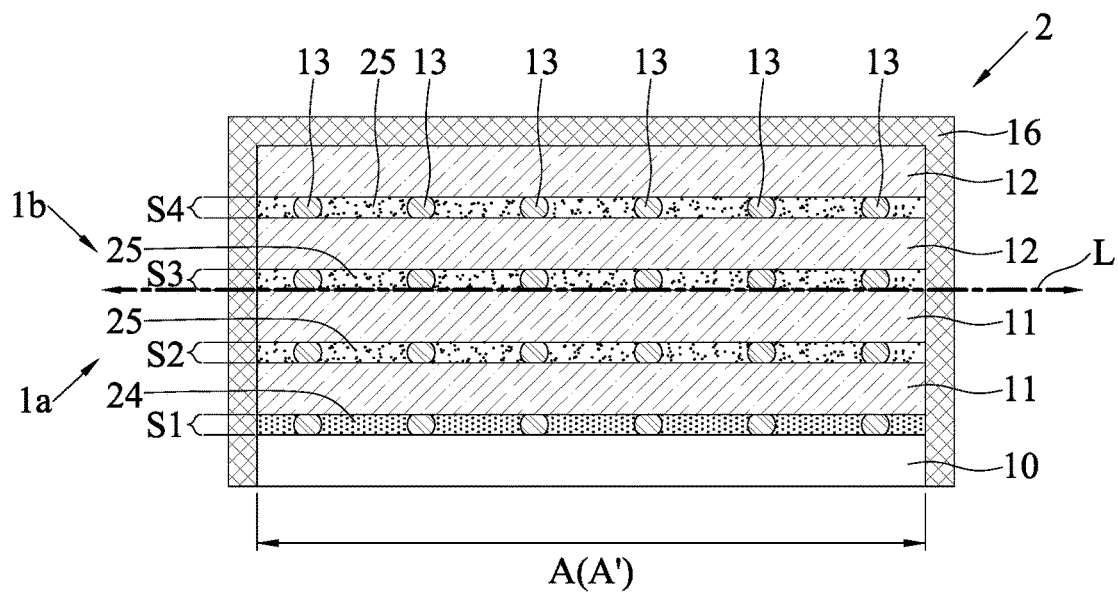
FIG. 2 is a cross-sectional schematic diagram depicting an electronic package in accordance with another embodiment of the present disclosure.
Figure 2:
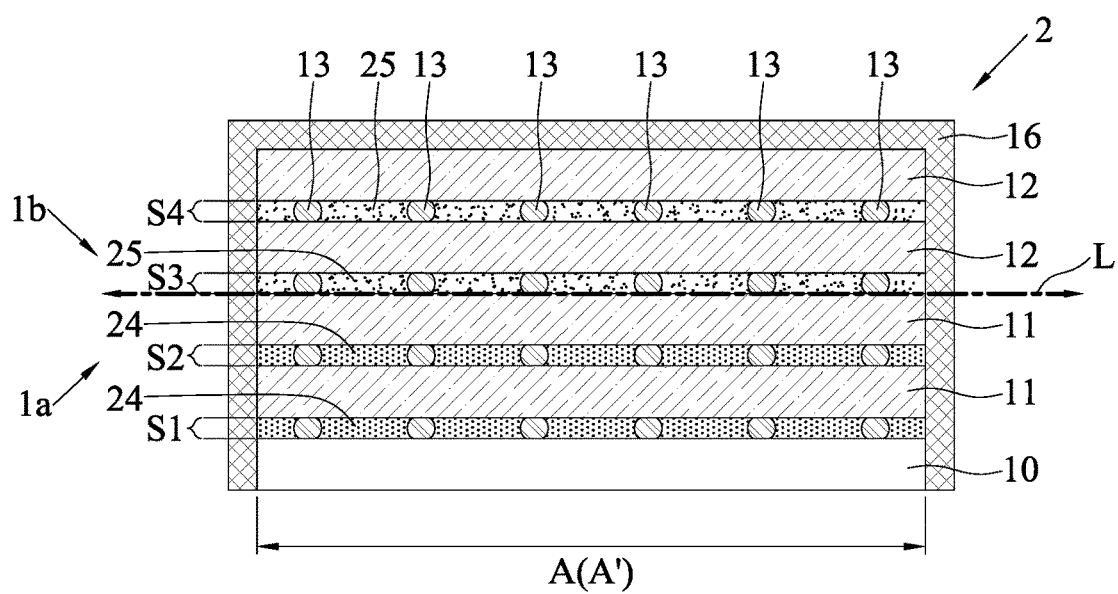
Figure 2A:
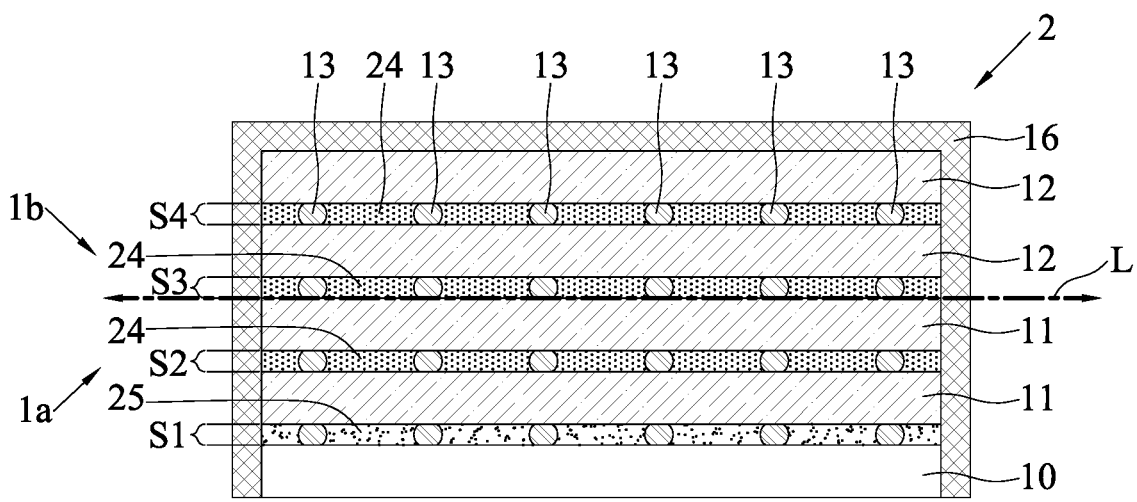
Figure 2A:
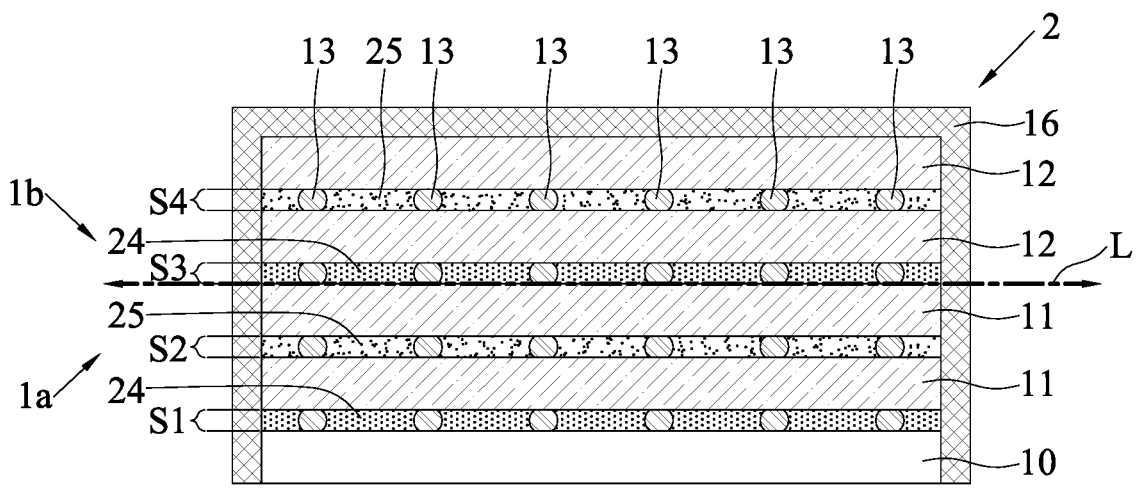
Figure 3:
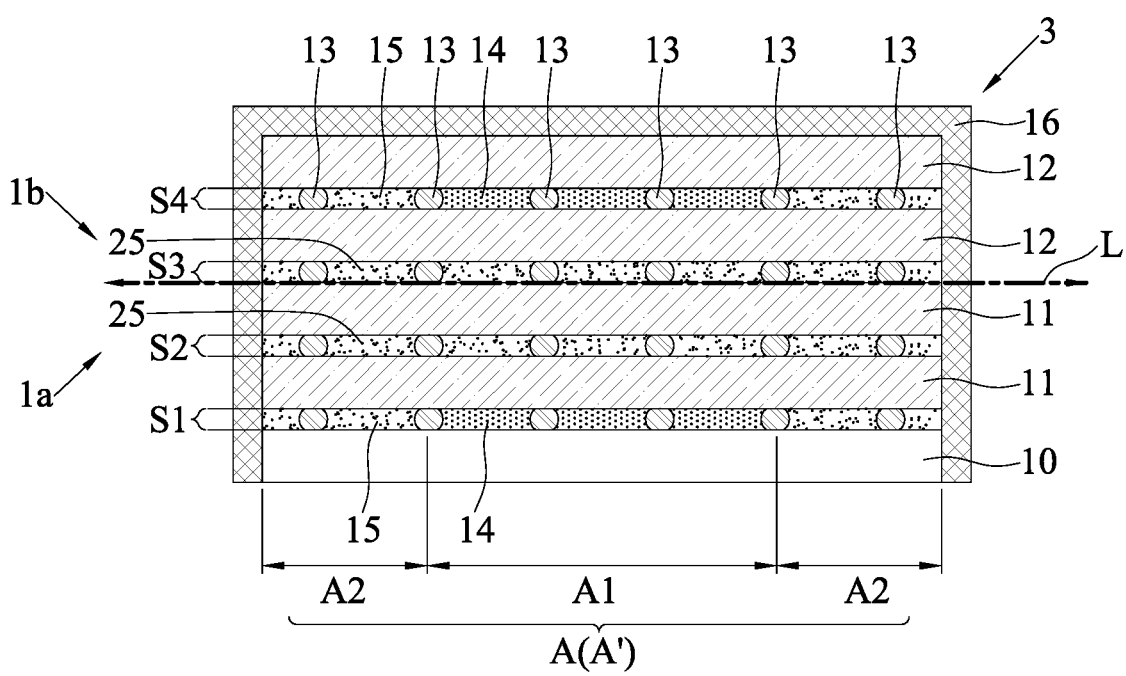
FIG. 3 is a cross-sectional schematic diagram depicting an electronic package in accordance with still another embodiment of the present disclosure.
Figure 3A:
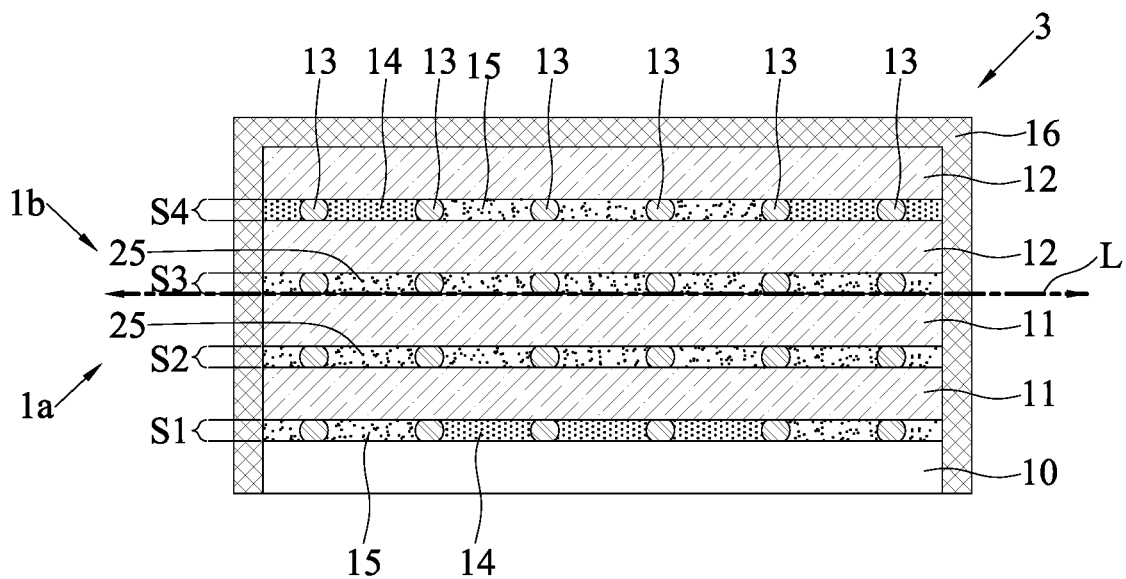
FIGS. 3A and 3A' are cross-sectional diagrams depicting other aspects of FIG. 3.
Figure 3A:
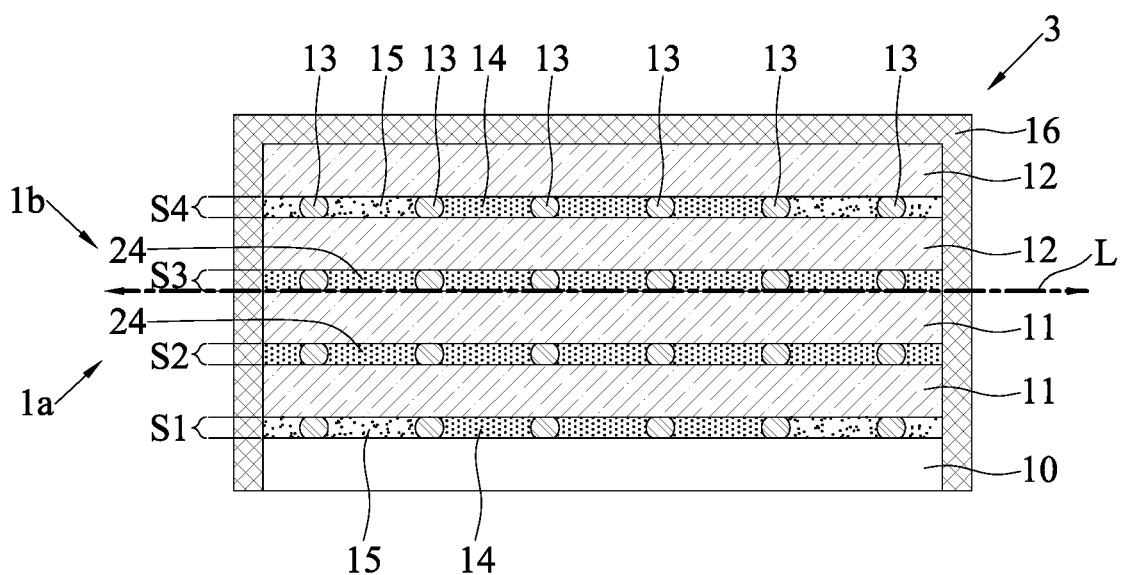

Moreover, in another embodiment, such as electronic packages 2 shown in FIGS. 2, 2', 2A and 2A', a first encapsulating portion 24 can be provided on the entire first and second layout areas A, A'. For example, the first encapsulating portion 24 can be provided entirely on the layout area(s) of at least one of the first to fourth fill space S1 to S4 (the first fill space S1 shown in FIG. 2, the second to fourth fill space S2, S3 to S4 shown in FIG. 2A, or the first and the third fill space S1 and S3 shown in FIG. 2A'). It can be appreciated that, as shown in FIG. 3A', the first encapsulating portion 14, 24 can be simultaneously partially provided and entirely provided on different first and/or second layout areas A, A'.

The second encapsulating portion 15 can be a solid filler, such as a non-conductive film (NCF) with the CTE ranging from 32 to 98. Thus, the material of the first encapsulating portion 14 is different from that of the second encapsulating portion 15. For example, the CTE of the first encapsulating portion 14 is different from the CTE of the second encapsulating portion 15.

In an embodiment, the second encapsulating portion 15 is partially provided on the first and second layout areas A, A'. For example, the second encapsulating portion 15 is only provided on the second segment A2, such as at the corners shown in FIG. 1' or at two opposite outer sides shown in FIG. 1". The second encapsulating portion 15 is partially provided on each of the layout areas of the first to the fourth fill space S1 to S4. It can be appreciated that the segments on which the first encapsulating portion 14 and the second encapsulating portion 15 are provided (as shown in FIGS. 1' and 1") can be interchanged.

Moreover, in another embodiment, as shown in FIGS. 2, 2', 2A and 2A', a second encapsulating portion 25 can be provided on the entire first and second layout areas A, A'. For example, the second encapsulating portion 25 can be provided entirely on the layout area(s) of at least one of the first to fourth fill space S1 to S4 (second to fourth fill space S2, S3 and S4 shown in FIG. 2, the first fill space S1 shown in FIG. 2A, or the second and fourth fill space S2 and S4 shown in FIG. 2A'). It can be appreciated that, in an electronic package 3 shown in FIG. 3 or 3A, the second encapsulating portion 15, 25 can be simultaneously partially provided and entirely provided on different first and/or second layout areas A, A'.

Figure 1A:
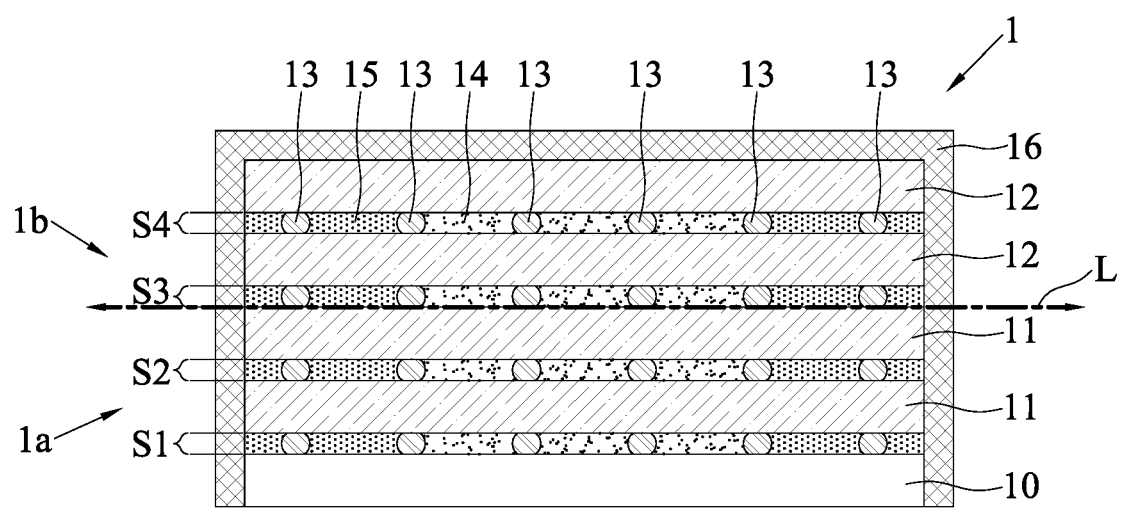
FIGS. 1A and 1A' are cross-sectional diagrams depicting other aspects of FIG. 1.
Figure 1A:
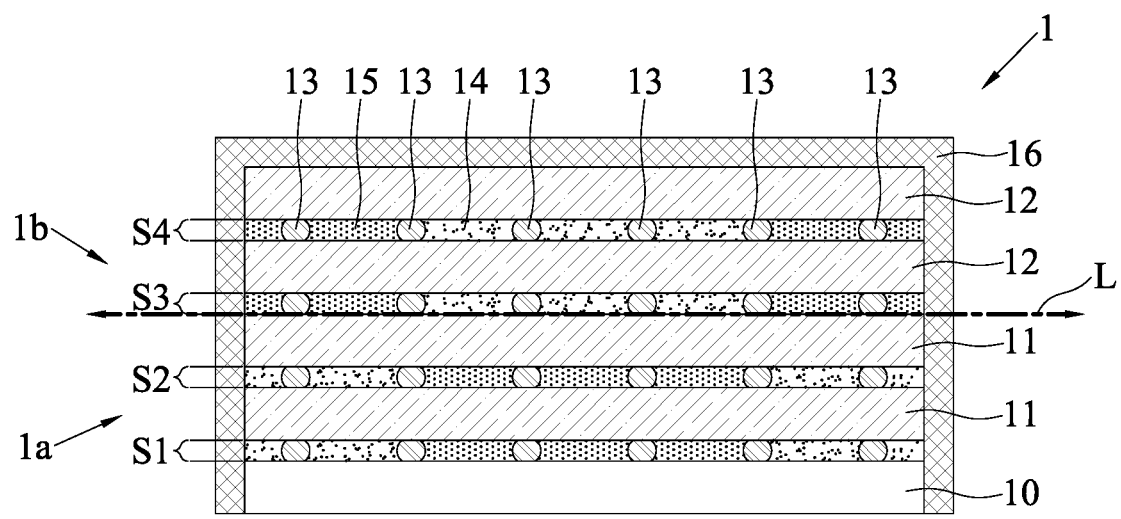

Therefore, the patterns of these layout areas can be the same (such as that shown in FIG. 1 or 1A) or different (such as that shown in FIG. 1A', 2, 2', 2A, 2A', 3, 3A, or 3A'). It can be appreciated that there are various ways of filling the first to the fourth fill space S1 to S4, the patterns of the first and/or second layout areas A, A' can be arranged according to the needs. For example, with respect to the first to the fourth fill space S1 to S4 (e.g., the vertical direction) or with respect to the first segment A1 and the second segment A2 (e.g., the longitudinal direction), the patterns of the encapsulating portions can be symmetric (as in FIGS. 3 and 3A') or non-symmetric (as in FIG. 3A), crossing (as in FIG. 1A' or 2A') or non-crossing over (as in FIG. 3), regular (as in FIG. 1 or 1A), or non-regular (as in FIG. 2 or 2A).

Furthermore, the electronic package 1 is defined with a stress balance line L depending on the overall stress distribution to help adjust the pattern of the first and second layout areas A, A'. For example, the encapsulating structures 1c of the first to the fourth fill space S1 to S4 are complementary to appropriately control the degree of warpage of the electronic package 1. The stress balance line L defines the electronic package 1 as the first package module 1a (the lower half of FIG. 1) and the second package module 1b (the upper half of FIG. 1) adjacent to each other, such that the strain of the first package module 1a (as shown by a direction of warpage W1 [i.e., a convex curve] in FIG. 1) and the strain of the second package module 1b (as shown by a direction of warpage W2 [i.e., a concave curve] in FIG. 1) are substantially complementary to each other (e.g., directions W1 and W2 are opposite to each other), and the stress of the two more or less cancel each other. As shown in FIGS. 1 to 4, the stress balance line L is at the uppermost first electronic component 11 (or at the lowermost second electronic component 12), so the first package module 1a includes at least one first electronic component 11, and the second package module 1b includes a plurality of second electronic components 12. It can be appreciated that, when the first package module 1a is provided with the first encapsulating portion 14, the second package module 1b must be provided with the second encapsulating portion 15; when the first package module 1a is provided with the second encapsulating portion 15, the second package module 1b must be provided with the first encapsulating portion 14. Thus, the first and the second encapsulating portions 14 and 15 are arranged on the first and the second package modules 1a and 1b based on the distribution of stress.

In addition, if one layout area is to be provided with both the first and second encapsulating portions 14 and 15 (as shown in FIGS. 1' and 1"), the manufacturing method for the layout area may include attaching the solid second encapsulating portion 15 on the surface of the first or the second electronic component 11, 12, so that the second encapsulating portion 15 forms a channel (i.e., the first segment A1). After a first electronic component 11 or a second electronic component 12 stacked, the fluid first encapsulating portion 14 is dispensed into one of the four openings (as shown by a direction of filling F in FIG. 1') of the channel (i.e., the first segment A1), such that the space corresponding to the first segment A1 is filled with the first encapsulating portion 14. The multi-axial channels shown in FIG. 1' is advantageous for spreading the first encapsulating portion 14 throughout the space corresponding to the first segment A1 (but with a more complicated manufacturing process), while the single-axial channel shown in FIG. 1" is advantageous for the manufacturing process (but is less easy to fill the space).

The packaging layer 16 is an insulating material, such as PI, a dry film, or an epoxy encapsulant or molding compound that can be formed by lamination, coating or molding.

In summary of the above, in the electronic package 1, 2, 3, 4 of the present disclosure, encapsulating portions of two different materials (the first and second encapsulating portions 14, 15) of the encapsulating structure 1c are used to create strains in different directions. Thus, when the encapsulating structure 1c is applied to the electronic package 1, 2, 3, 4 having multiple layers of fill space (the first to the fourth fill space S1 to S4), the first and the second encapsulating portions 14 and 15 can be arranged to adjust the distribution of stress in the electronic package 1, 2, 3, 4, thereby better controlling the degree of warpage of the electronic package 1, 2, 3, 4, i.e., minimizing deformation of the electronic package 1, 2, 3, 4. For example, the CTE of the first encapsulating portion 14 is different from the CTE of the second encapsulating portion 15, the first and the second layout areas A1, A' can be arranged to have various different patterns in the first to the fourth fill space S1 to S4 according to the needs, such that the electronic package 1, 2, 3, 4 can have a balanced stress distribution.

Moreover, the solid NCF (the second encapsulating portion 15) allows stress to be spread out more evenly, which reduces the uneven spreading of the stress in the fluid underfill material (the first encapsulating portion 14). Therefore, when the two are used together, stress can be cancelled out. Thus, compared to the prior art in which the conductive bumps are encapsulated entirely by a fluid underfill material, the encapsulating structure 1c of the present disclosure effectively prevents the stress build up in the layers (the first to the fourth fill space S1 to S4), that is, the stress at opposite sides of the stress balance line L can be substantially cancelled out.

In addition, as shown in FIGS. 2 and 2', the CTE of the first encapsulating portion 24 is greater than the CTE of the second encapsulating portion 25, and the solid NCF (the second encapsulating portion 15) allows stress to be spread out more evenly, so the first encapsulating portion 24 can be arranged in the first and/or the second fill space S1 and S2 (corresponding to the first layout area A of the first package module 1a). During manufacturing, the second encapsulating portion 25 in the upper portion of the electronic package 2 can first be formed before the first encapsulating portion 24 in the lower portion is formed. As such, the stress distribution and the degree of warpage of the second encapsulating portion 25 are already set and less likely to be affected by the high-temperature thermal manufacturing process for the first encapsulating portion 24. Thus, when the first encapsulating portion 24 is applied in the final step, the overall stress distribution of the electronic package 2 can be effectively and well controlled. When the first encapsulating portion 24 is applied and cured, the first encapsulating portion 24 will contract during cooling process, stress pulls the electronic package 2 in the opposite direction, thus alleviating the degree of warpage and a degree of warpage within the tolerance range can be attained.

Moreover, if a single layout area is provided with both the first and the second encapsulating portions 14 and 15, in manufacturing, the second encapsulating portion 15 can be used to form a channel for fluid, so that during the subsequent dispensing process of the first encapsulating portion 14, dispensing only needs to be applied once to fill up the fill space corresponding to the first or the second layout area A, A', thereby speeding up the overall production schedule.

The above embodiments are merely provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
 a carrier;
 a first package module disposed on the carrier and including at least one first electronic component, with a first layout area being defined by a lower surface of the first electronic component and provided with one of a first encapsulating portion and a second encapsulating portion, the material of the second encapsulating portion being different from that of the first encapsulating portion; and
 a second package module stacked on top of the first package module and including a plurality of second electronic components stacked to each other, with a second layout area being defined by a lower surface of each of the second electronic components, at least one of the plurality of second layout areas being provided with the other one of the first encapsulating portion and the second encapsulating portion relative to the first layout area, wherein a stress balance line is defined between the first package module and the second package module, and the first encapsulating portion and the second encapsulating portion are arranged in a way such that a strain of the first package module and a strain of the second package module are complementary to each other, and a stress of the first package module and a stress of the second package module cancel each other out.

2. The electronic package of claim 1, wherein the first encapsulating portion and the second encapsulating portion are partially provided on the first layout area.

3. The electronic package of claim 1, wherein the first encapsulating portion and the second encapsulating portion are partially provided on the second layout area.

4. The electronic package of claim 1, wherein the first encapsulating portion is provided on an entirety of the first layout area.

5. The electronic package of claim 1, wherein the first encapsulating portion is provided on an entirety of the second layout area.

6. The electronic package of claim 1, wherein the second encapsulating portion is provided on an entirety of the first layout area.

7. The electronic package of claim 1, wherein the second encapsulating portion is provided on an entirety of the second layout area.

8. The electronic package of claim 1, wherein a coefficient of thermal expansion (CTE) of the first encapsulating portion is different from that of the second encapsulating portion.

9. The electronic package of claim 1, wherein the second encapsulating portion is a solid filler.

10. The electronic package of claim 1, wherein the plurality of second electronic components are stacked to each other via a plurality of conductive components.

11. The electronic package of claim 1, wherein the second electronic component is stacked on top of the first electronic component via a plurality of conductive components.

12. The electronic package of claim 1, wherein the first electronic component is stacked on top of the carrier via a plurality of conductive components.

13. The electronic package of claim 1, wherein the plurality of first electronic components are stacked on top of the carrier, and the first electronic components are stacked to each other via a plurality of conductive components.

14. The electronic package of claim 1, further comprising a packaging layer encapsulating the first electronic component and the second electronic components.

15. The electronic package of claim 1, wherein the first layout area is defined with a first segment and a second segment adjacent to the first segment, and the first segment is crisscross or quadrangle in shape.

16. The electronic package of claim 1, wherein the second layout area is defined with a first segment and a second segment adjacent to the first segment, and the first segment is crisscross or quadrangle in shape.

17. The electronic package of claim 1, wherein the second encapsulating portion is provided at one or more corners of the first layout area or the second layout area.

18. The electronic package of claim 1, wherein the second encapsulating portion is provided at two opposite outer sides of the first layout area or the second layout area.

* * * * *